(12) United States Patent
Wu et al.

(10) Patent No.: US 11,749,321 B2
(45) Date of Patent: *Sep. 5, 2023

(54) MULTI-STAGE BIT LINE PRE-CHARGE (71) Applicant: Taiwan Semiconductor Manufacturing Company Limited, Hsinchu (TW)

(72) Inventors: Wei-Cheng Wu, Hsinchu (TW); Kao-Cheng Lin, Taipei (TW); Chih-Cheng Yu, Hsinchu (TW); Pei-Yuan Li, Hsinchu (TW); Chien-Chen Lin, Kaohsiung (TW); Wei Min Chan, Taipei (TW); Yen-Huei Chen, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 10 days.

This patent is subject to a terminal disclaimer.

(21) Appl. No.: 17/408,567

(22) Filed: Aug. 23, 2021

(65) Prior Publication Data

US 2021/0383847 A1   Dec. 9, 2021

Related U.S. Application Data

(63) Continuation of application No. 16/785,875, filed on Feb. 10, 2020, now Pat. No. 11,100,964.

(51) Int. Cl.
*G11C 7/12* (2006.01)
*G11C 11/419* (2006.01)
(Continued)

(52) U.S. Cl.
CPC .............. *G11C 7/12* (2013.01); *G11C 7/1048* (2013.01); *G11C 11/4076* (2013.01);
(Continued)

(58) Field of Classification Search
CPC ........ G11C 7/12; G11C 7/1048; G11C 11/419
See application file for complete search history.

(56) References Cited

U.S. PATENT DOCUMENTS 5,914,903 A    6/1999  Kanma et al.
6,075,733 A *  6/2000  Brown .................... G11C 7/12
                                                    365/205

(Continued)

FOREIGN PATENT DOCUMENTS

TW      594783      6/2004
TW    201539445    10/2015

OTHER PUBLICATIONS

Korean Office Action; Application No. 10-2020-0067566; dated Mar. 12, 2021.

(Continued)

*Primary Examiner* — Mushfique Siddique
(74) *Attorney, Agent, or Firm* — Jones Day (57) ABSTRACT

Systems and method are provided for a memory circuit that includes a bit cell responsive to a bit line signal line and a bit line bar signal line configured to store a bit of data. A pre-charge circuit is configured to charge one of the bit line and bit line bar signal lines prior to a read operation, where the pre-charge circuit includes a first pre-charge component and a second pre-charge component, the first and second pre-charge components being individually controllable for charging the bit line and bit line bar signal lines.

20 Claims, 9 Drawing Sheets (51) Int. Cl.
  *G11C 7/10* (2006.01)
  *G11C 11/4093* (2006.01)
  *G11C 11/4091* (2006.01)
  *G11C 11/4094* (2006.01)
  *G11C 11/4076* (2006.01)
  *G11C 11/416* (2006.01)
  *G11C 11/413* (2006.01)
  *G11C 11/4096* (2006.01)

(52) U.S. Cl.
  CPC ...... *G11C 11/4091* (2013.01); *G11C 11/4093* (2013.01); *G11C 11/4094* (2013.01); *G11C 11/4096* (2013.01); *G11C 11/413* (2013.01); *G11C 11/416* (2013.01); *G11C 11/419* (2013.01)

(56) References Cited

U.S. PATENT DOCUMENTS

| | | | |
|---|---|---|---|
| 6,205,068 B1 | 3/2001 | Yoon | |
| 6,275,430 B1 * | 8/2001 | Ka | G11C 11/4096 365/189.11 |
| 6,807,107 B1 * | 10/2004 | McGee | G11C 11/412 365/189.08 |
| 7,920,397 B1 * | 4/2011 | Nataraj | G11C 29/50 365/49.1 |
| 2003/0072205 A1 * | 4/2003 | Ma | G11C 15/043 365/203 |
| 2009/0154274 A1 | 6/2009 | Abu-Rahma et al. | |
| 2015/0098267 A1 | 4/2015 | Jain et al. | |
| 2016/0307618 A1 | 10/2016 | Kim | |
| 2018/0166132 A1 * | 6/2018 | Ishii | G11C 11/419 |
| 2018/0350429 A1 | 12/2018 | Jeong | |
| 2020/0005877 A1 | 1/2020 | Arora et al. | |
| 2020/0135245 A1 * | 4/2020 | McCombs | G11C 8/08 |

OTHER PUBLICATIONS

Taiwan Office Action; Application No. 109125096; dated Mar. 29, 2021.

* cited by examiner

MULTI-STAGE BIT LINE PRE-CHARGE

CROSS-REFERENCE TO RELATED APPLICATIONS

This application is a continuation application of U.S. application Ser. No. 16/785,875, filed Feb. 10, 2020, which is incorporated herein by reference in its entirety.

BACKGROUND

A bit cell of a memory (e.g., an SRAM device) may take the form of two cross coupled inverters, which act as latch storage elements, and two switches connecting the two inverters to complementary bit lines to communicate data into or out of the bit cell. The switches (e.g., NMOS pass transistors) are controlled by a word line. When the switches are off, the bit cell keeps one of its two possible steady states. To write data into a bit cell, the value to be written and its complement are placed onto the bit lines and the word line is raised simultaneously. To read a value from the bit cell, both bit lines are pre-charged high, and the word line is raised. The bit line relative to the bit cell node that contains a zero value begins discharging, providing differing signals that can be sensed and output from the memory.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As noted above, in certain memories, read operations are initiated by pre-charging two bit lines (e.g., BL, BLB) to which a bit cell is connected to a high level. When a word line (e.g., WL) of the bit cell is activated, the bit cell pulls a particular one of the bit lines low. A sense amplifier senses the difference between the two bit lines, and outputs a corresponding data value accordingly. The bit lines are then pre-charged again to facilitate a next read operation. To facilitate high speed operation, it may be desirable to start a next cycle of pre-charging promptly following the conclusion of the previous read (e.g., start pre-charging immediately after the WL goes low). In some instances, such as based on fabrication process variations, the desired timing may not be realized in practice. Untimely signals (e.g., a pre-charge control signal being activated before the word line goes low) can result in anomalous operation. For example, coupling between a charging bit line and a word line can result in disturbance of the bit cell state, potentially changing a bit cell value during a read operation.

Figure 1:
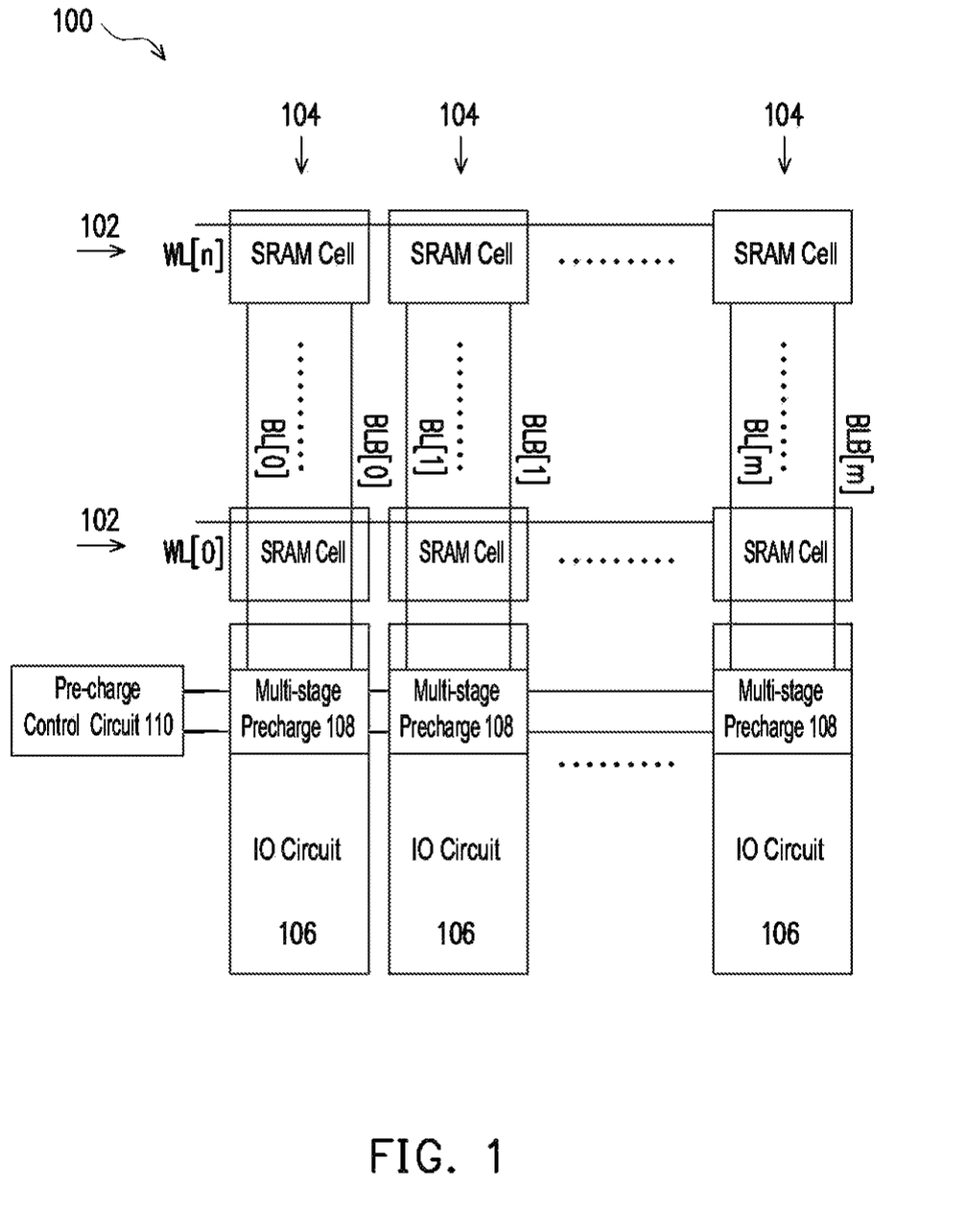
FIG. 1 is a block diagram depicting a memory that includes a multi-stage pre-charge circuit according to an exemplary embodiment.

FIG. 1 is a block diagram depicting a memory that includes a multi-stage pre-charge circuit according to an exemplary embodiment. A memory 100 includes a two dimensional array of SRAM bit cells. Each row 102 of bit cells is connected to a word line WL[0] . . . WL[n] that provides control to the bit cells of a data word. Each column 104 of bit cells is associated with an input/output (IO) circuit 106 that includes a multi-stage pre-charge circuit 108. The multi-stage pre-charge circuits 108 receive first and second control signals from a pre-charge control circuit 110 that manages pre-charge operations in the pre-charge circuits 108.

Figure 2:
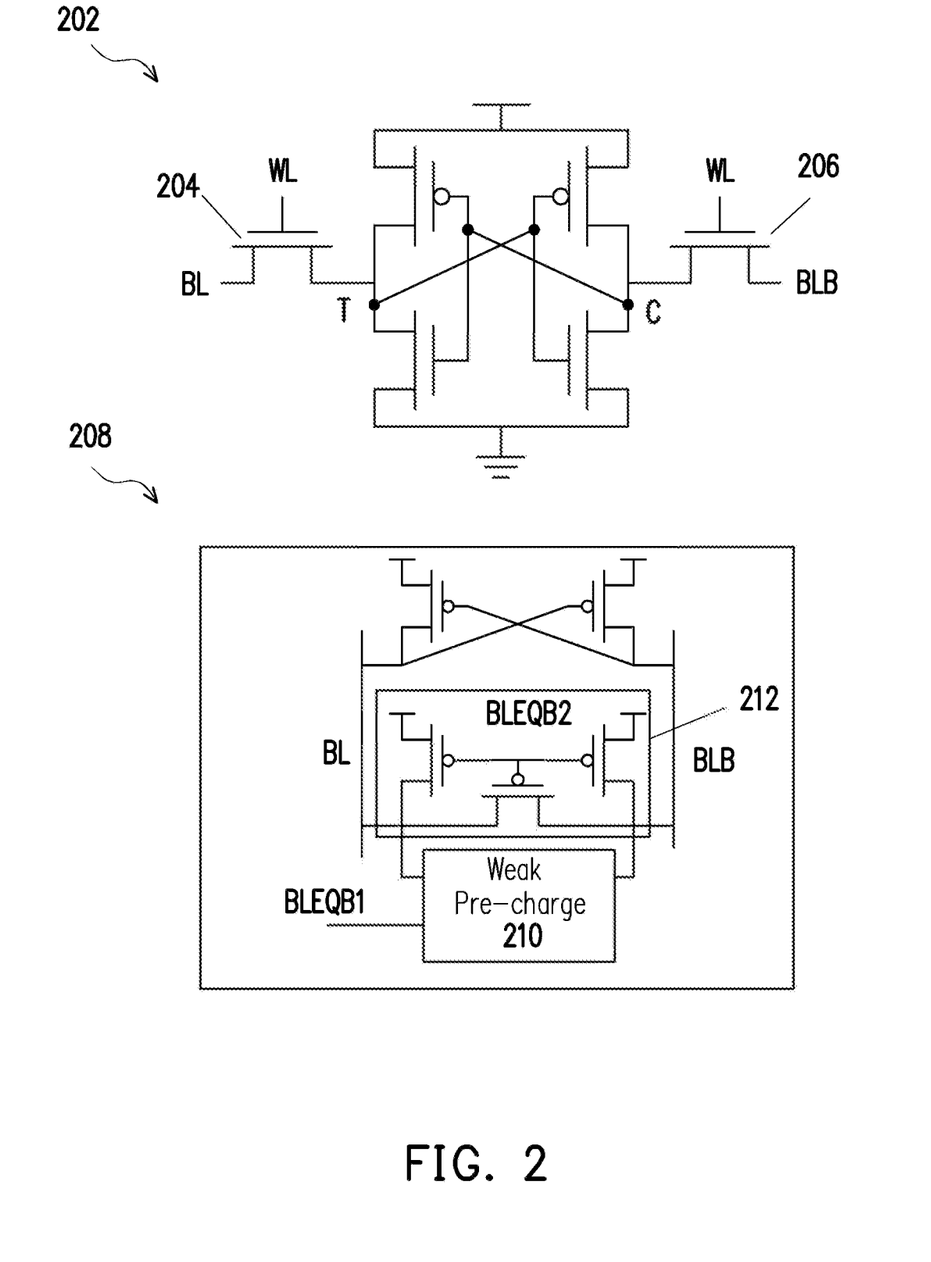
FIG. 2 is a diagram depicting a bit cell and a multi-stage pre-charge circuit in accordance with embodiments.

FIG. 2 is a diagram depicting a bit cell and a multi-stage pre-charge circuit in accordance with embodiments. As described above, a bit cell 202 comprises a pair of cross coupled inverters formed via two NMOS and two PMOS transistors. Data is stored in the bit cell 202 by applying different signal levels to the T and C nodes of the bit cells during a write operation via BL and BLB by controlling of switch transistors 204, 206 using the WL signal. Upon deassertion of the WL signal, the applied differential signals will be maintained at the T and C nodes, indicating a stored data value (e.g., 1 when T is high and C is low and 0 when T is low and C is high, or vice versa).

During a read operation both BL and BLB are pre-charged high. When the read operation is initiated by asserting WL, the T or C node having the low state will pull its corresponding bit line low via the ground node (i.e., if T is low, BL will be pulled low upon assertion of WL; if C is low, BLB will be pulled low upon assertion of WL). A sense amplifier senses the polarity of the difference between BL and BLB and outputs a corresponding value of the bit read from the bit cell 202. The low bit line must then be pre-charged again (re-charged) before another read operation can occur. Thus the pre-charge time limits the speed at which data can be read from the memory.

An example two-stage pre-charge circuit is depicted at 208. The pre-charge circuit includes a first pre-charge component 210, labeled weak pre-charge, and a second pre-charge component 212. The first 210 and second 212 pre-charge components are individually controllable for charging the BL and BLB signal lines. Specifically, a pre-charge control circuit, described further below, provides a first control signal (BLEQB1) to the first pre-charge component 210 and a second control signal (BLEQB2) to the second pre-charge component 212. A multi-stage pre-charge circuit, such as the one illustrated in FIG. 2 at 208, can provide fast memory operation while avoiding anomalous memory operation.

Figure 3:
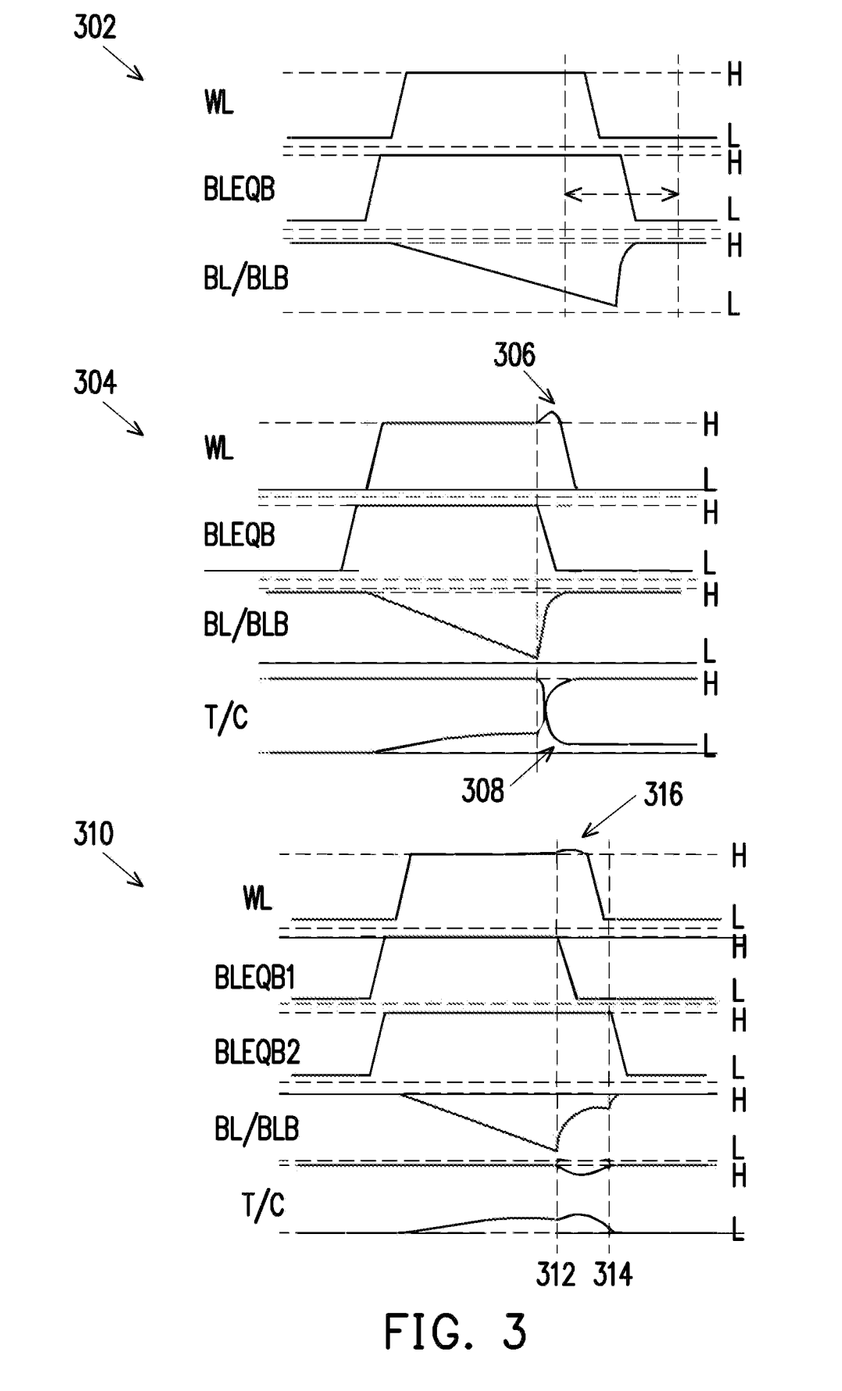
FIG. 3 provides timing diagrams associated with exemplary operations in embodiments of the disclosure.

As noted above, to minimize pre-charge-related latency, it may be desirable to begin the next pre-charge cycle as quickly as possible after a read operation completes. FIG. 3 provides timing diagrams associated with exemplary operations in embodiments of the disclosure. In a first example at 302, a pre-charge circuit is operated with reliance on only a single stage (e.g., the second pre-charge component 212 of FIG. 2). When operating in-specification, the control signal BLEQB for the single stage transitions from high to low levels to begin pre-charging as soon as possible following the conclusion of a read operation, whose duration is indicated by the high WL signal. Specifically, during the read operation that starts when WL transitions high, one of BL/BLB is pulled low by the specific T/C node that holds a low logic level. That pulling low of one of BL/BLB is illustrated by the downward sloping BL/BLB signal. At a point during the read operation (e.g., near the end of the period where WL is high), a sense amplifier senses the difference between BL and BLB, caused by one of those signals being pulled low, where the sense amplifier outputs a corresponding sensed data value for the bit cell. The BL/BLB signal that was pulled low must then be returned to a high level (i.e., pre-charged) to facilitate a next read operation. Some implementations aim to start pre-charging by bringing BLEQB low as soon after the read operation is over, when WL goes low, to ready the bit cell for a next read operation, where both BL and BLB are at a high level.

But in reality, signal timing in a memory may not operate exactly as designed. Process variations, parasitic capacitances, or other factors may result in signals being received at a different time than designed. An example of such anomalous signal operation is illustrated at 304. There, the pre-charge control signal BLEQB that was intended to transition low just after WL goes low, actually transitions low before WL goes low at the end of the read operation. This results in the one of BL/BLB that was being pulled low by the read operation being recharged to a high level prematurely while WL is still high. The rising BL/BLB signal may result in coupling with the WL signal, illustrated at 306, which may in some instances disturb the contents of the T/C nodes in the bit cell, as illustrated at 308. There, the levels at the T and C nodes, and correspondingly the contents of the bit cell are changed during a read operation, an anomalous result.

The example at 310 illustrates control of a multi-stage pre-charge circuit that in embodiments enables fast pre-charging while mitigating the risk of anomalous circuit behavior. Specifically, a first pre-charge component (e.g., FIG. 2, 210) is controlled by a first control signal BLEQB1 and a second pre-charge component (e.g., FIG. 2, 212) is controlled by a second control signal BLEQB2. In this example, the first control signal BLEQB1 activates the first pre-charge component at 312 prior to the conclusion of the read operation, before WL goes low. The one of BL/BLB that had been pulled low begins to pre-charge, but at a slower rate than the examples of 302, 304. At 314, following WL going low at the end of the read operation, the second control signal BLEQB2 activates the second pre-charge component. This activation increases the rate of pre-charging of BL/BLB to a high level (e.g., where the first pre-charge component is configured to charge at a first average rate between 312 and 314, and the second pre-charge component is configured to charge, alone or in combination with the first pre-charge component, at a second average rate after 314, the second average rate being faster than the first average rate). While some coupling between the BL/BLB signal line being charged and the WL signal may occur at 316, with corresponding minor disturbances at the T/C nodes between 312 and 314, those disturbances are not sufficient enough to disturb (e.g., flip) the bit cell data contents.

Figure 4:
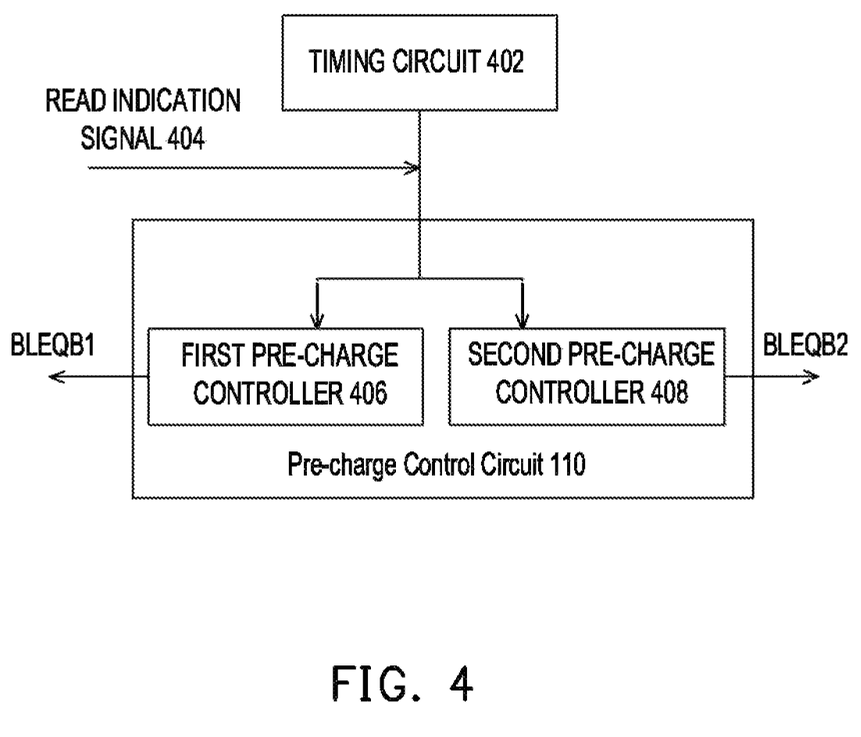
FIG. 4 is a block diagram depicting a pre-charge module for controlling a first pre-charge component and a second pre-charge component of a pre-charge circuit in accordance with embodiments.

FIG. 4 is a block diagram depicting a pre-charge module for controlling a first pre-charge component and a second pre-charge component of a pre-charge circuit in accordance with embodiments. A pre-charge control circuit 110 is responsive to a timing circuit 402 and an input signal 404 that indicates that a read operation is to occur (e.g., the WL signal itself or another indicator). The pre-charge control circuit 110 includes a first pre-charge controller 406 that outputs a first control signal (BLEQB1) for controlling a first pre-charge component and a second pre-charge controller 408 that outputs a second control signal (BLEQB2) for controlling a second pre-charge component. In one example, upon receiving a read indication signal 404, both the first and second pre-charge controllers 406, 408 ensure that their control signals BLEQB1, BLEQB2 are in states that inhibit pre-charging during some or all of the read operation. Based on a known time associated with a read operation and signals from the timing circuit (e.g., a clock circuit) 402, the pre-charge control circuit 110 controls the start of pre-charging of the one of BL/BLB that is pulled low. In one example, the first pre-charge controller 406 is configured to enable a first pre-charge component via BLEQB1 shortly before the conclusion of the read operation (e.g., 90% of the way through the duration of the read operation before WL goes low). The second pre-charge controller 408 is configured to enable the second pre-charge component, which may operate alone or in conjunction with the first pre-charge component, via BLEQB2 just after the conclusion of the read operation (e.g., at 110% of the duration of the read operation). Because the BL/BLB line is partially pre-charged when the read operation is completed, the second control signal may be asserted later than single stage pre-charging implementations (e.g., not as close to the WL transition) to avoid anomalous operation, while still returning the BL/BLB line promptly to a high level.

Figure 5:
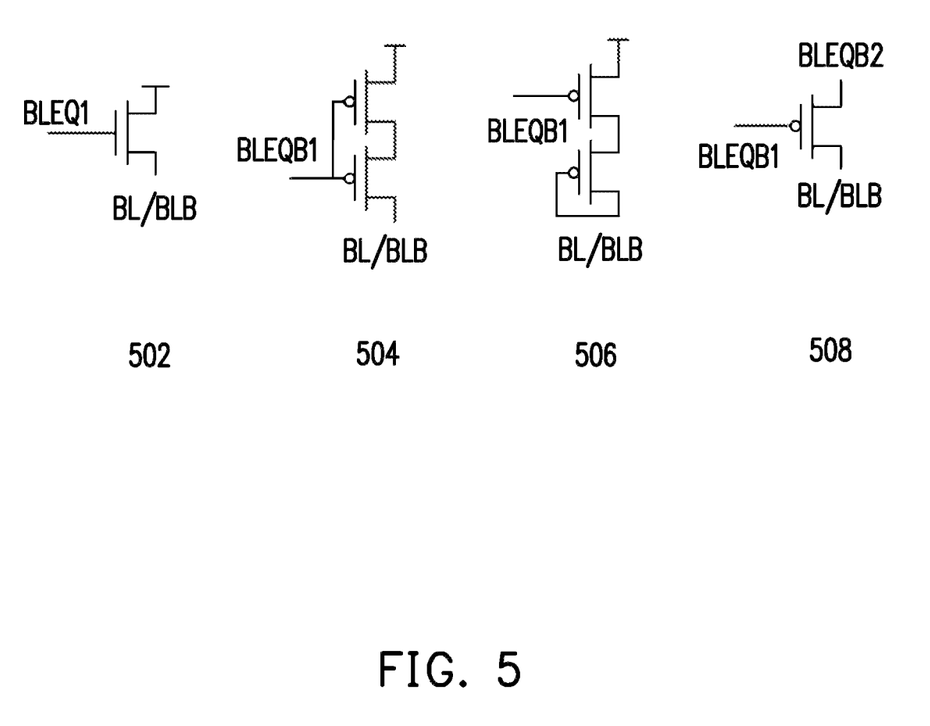
FIG. 5 depicts example pre-charge components in accordance with embodiments.

Pre-charge components of a pre-charge circuit may take a variety of forms. FIG. 5 depicts example pre-charge components in accordance with embodiments. In a first example 502, a pre-charge component (e.g., FIG. 2, 210) takes the form of an NMOS transistor positioned between a source node and a node connected to both the bit line/bit line bar signal lines, one of which is being pre-charged. When the first control signal BLEQ1 is high, the pre-charge component is activated.

In a second example 504, the pre-charge component comprises two PMOS transistors connected in series between a source node and a node connected to both the bit line/bit line bar signal lines. The two transistors have gates controlled by the first control signal. When the first control signal BLEQB1 is low, the pre-charge component is activated.

In a third example 506, the first pre-charge component comprises two PMOS transistors connected in series between a source node and the bit line/bit line bar signal lines. A first of the two transistors has a gate controlled by the first control signal. A second of the two transistors has a gate controlled by a signal based on a signal level at a node connected to both the bit line/bit line bar signal lines. When the first control signal BLEQB1 and one of the BL/BLB signals are low, the pre-charge component is activated.

In a fourth example 508, the first pre-charge component comprises an PMOS transistor between a second control signal and a node connected to both the bit line/bit line bar signal lines, the transistor having a gate controlled by the first control signal. When the first control signal BLEQB1 is low and the second control signal is high (e.g., when the second control signal is inhibiting the second pre-charge component), the pre-charge component is activated.

Figure 6:
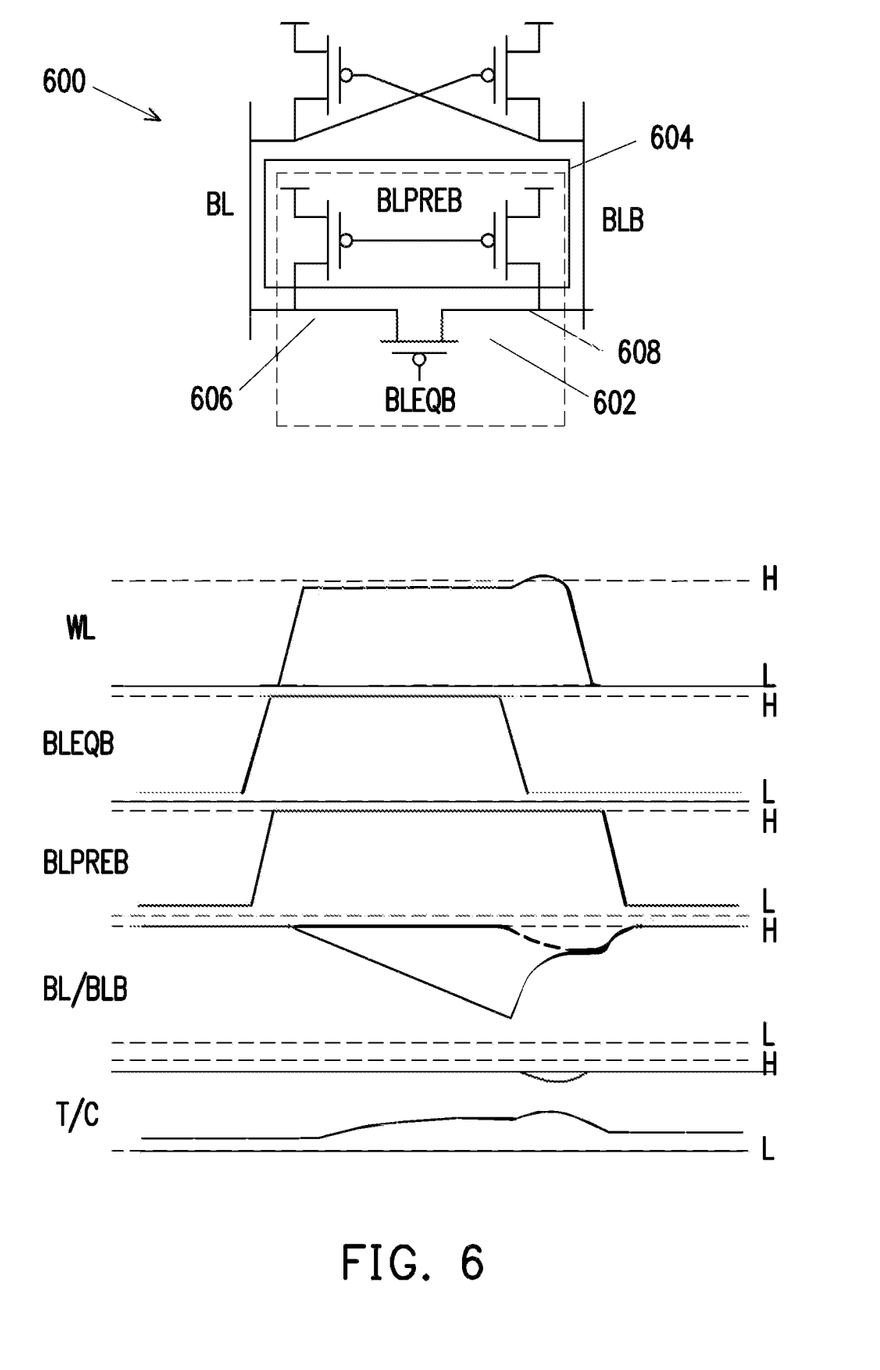
FIG. 6 is a diagram depicting another example pre-charge circuit in accordance with an embodiment.

FIG. 6 is a diagram depicting another example pre-charge circuit in accordance with an embodiment. In the example of FIG. 6, a pre-charge circuit includes a first pre-charge component 602 and a second pre-charge component 604. The first pre-charge component 602 comprises a PMOS transistor between a first node 606 connected to the bit line signal line and a second node 608 connected to the bit line bar signal line, the transistor having a gate controlled by the first control signal BLEQB. The second pre-charge component 604 comprises two second stage transistors having gates controlled by the second control signal BLPREB, one second stage transistor being positioned between a source node and the first node 606, and another second stage transistor being positioned between the source node and the second node 608. In one example of operating the pre-charge circuit of FIG. 6, the control signals BLEQB, BLPREB are raised to high levels near (e.g., just before, at the same time, just after) the time that WL goes high to initiate a read operation. One of BL/BLB is pulled low over time according to the status of the T and C nodes. Before the read operation ends when WL goes low, the first control signal BLEQB is brought low to initiate pre-charging via the first pre-charge component 602. The one of BL/BLB that was pulled to a low level begins to pre-charge high, with some corresponding pulling down of the other bit line via equalization, during the remainder of the read operation. This may result in some coupling and corresponding effect on the WL signal. But that coupling is insufficient to affect the status of the T/C nodes. After the conclusion of the read operation when WL goes low, the second control signal BLPREB is brought low to initiate pre-charging via the second pre-charge component 604 in combination with the first pre-charge component 602, promptly bringing both BL and BLB to high states in preparation for a next read operation.

Figure 7:
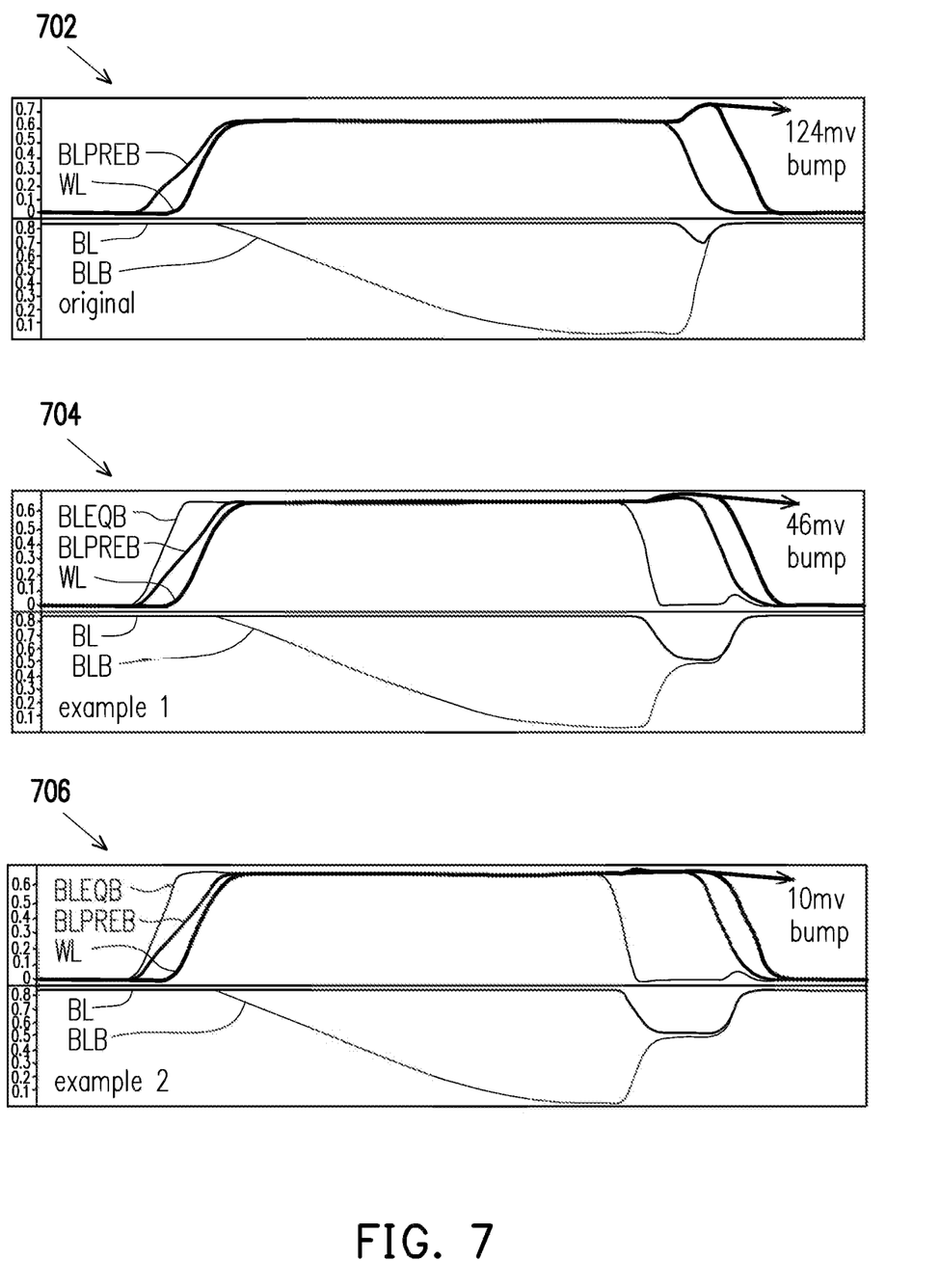
FIG. 7 is a diagram depicting operation of control signals to limit a magnitude of word line coupling in accordance with embodiments.

As noted above, coupling between a pre-charging BL/BLB and the WL signal can result in anomalous bit cell behavior. In some embodiments, limiting a magnitude of that coupling is desirable. FIG. 7 is a diagram depicting operation of control signals to limit a magnitude of word line coupling in accordance with embodiments. In operating the pre-charge circuit of FIG. 6, a first simulation at 702 illustrates operation of only the second pre-charge component 604 via the BLPREB signal activation just before the WL signal transitions low. In this simulation 702, the BLB signal has been pulled low via the read operation and is re-charged at high speed when BLPREB goes low, resulting in a 124 mv disturbance of the WL line.

The second 704 and third 706 simulations utilize both pre-charge components 602, 604 of FIG. 6. In the second simulation 704, the first control signal BLEQB activates and initiates pre-charging of BLB and a corresponding pulling down of BL via equalization that occurs when the first pre-charge component is activated. This results in a 46 mv disturbance of the WL line, which limits the risk of anomalous bit cell behavior compared to the 124 mv disturbance at 702. The BL/BLB signals are brought the remainder of the way high by activation of the second pre-charge component when BLPREB goes low, just before the WL goes low.

In the third simulation 706, the first control signal BLEQB (and first pre-charge component) is activated earlier than the second simulation 704. This results in an even smaller disturbance to WL, 10 mv, illustrating that timing of activation of the first and second pre-charge components can be controlled to mitigate bit line to WL coupling to an acceptable level.

Figure 8:
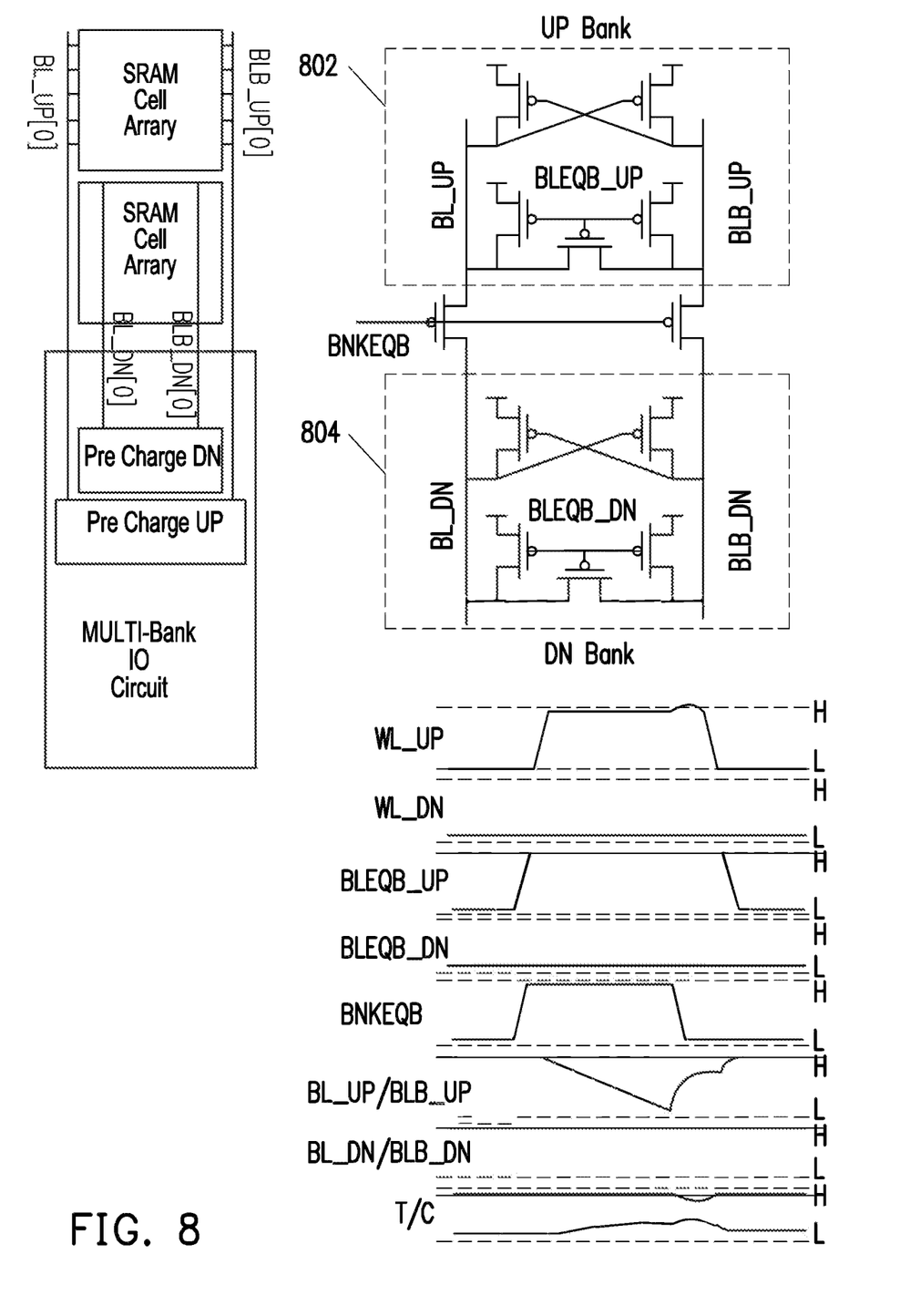
FIG. 8 is a diagram depicting a memory circuit where a first pre-charge component also serves as a second pre-charge component for another memory bank in accordance with embodiments.

A first pre-charge component may be positioned in a variety of locations within a memory circuit. FIG. 8 is a diagram depicting a memory circuit where a first pre-charge component also serves as a second pre-charge component for another memory bank in accordance with embodiments. Specifically, a BL of an upper memory bank BL_UP is connected with a BL of a lower memory bank BL_DN via a PMOS transistor controlled by a BNKEQB control signal. Similarly, a BLB of an upper memory bank BLB_UP is connected with a BLB of a lower memory bank BLB_BN via another PMOS transistor controlled by a BNKEQB control signal.

During an upper bank read operation, a word line associated with the upper bank WL_UP goes high and a control signal for the pre-charge circuit of the upper bank BLEQB_UP and BNKEQB go high to inhibit pre-charging during the read operation, such that one of BL_UP/BLB_UP can be pulled low according to the corresponding data stored in the upper bank bit cell. Because a read operation is not occurring in the lower bank, both BL_DN and BLB_DN have been charged high. The connections to the upper bank BL/BLB via the two PMOS transistors controlled by BNKEQB enable BL_DN and BLB_DN to be used as a source for a first-stage pre-charge of BL_UP/BLB_UP at the conclusion of the upper bank read operation. Specifically, near the end of the read operation (e.g., before WL_UP goes low), BNKEQB is brought low to enable some pre-charging of BL_UP/BLB_UP from the BL_DN/BLB_DN lines, such that the pre-charging circuit 804 of the lower bank operates as both a first pre-charge component for the upper bank and a second pre-charge component for the lower bank. At a later time, BLEQB_UP is brought low enabling the remainder of pre-charging of BL_UP/BLB_UP to occur.

Figure 9:
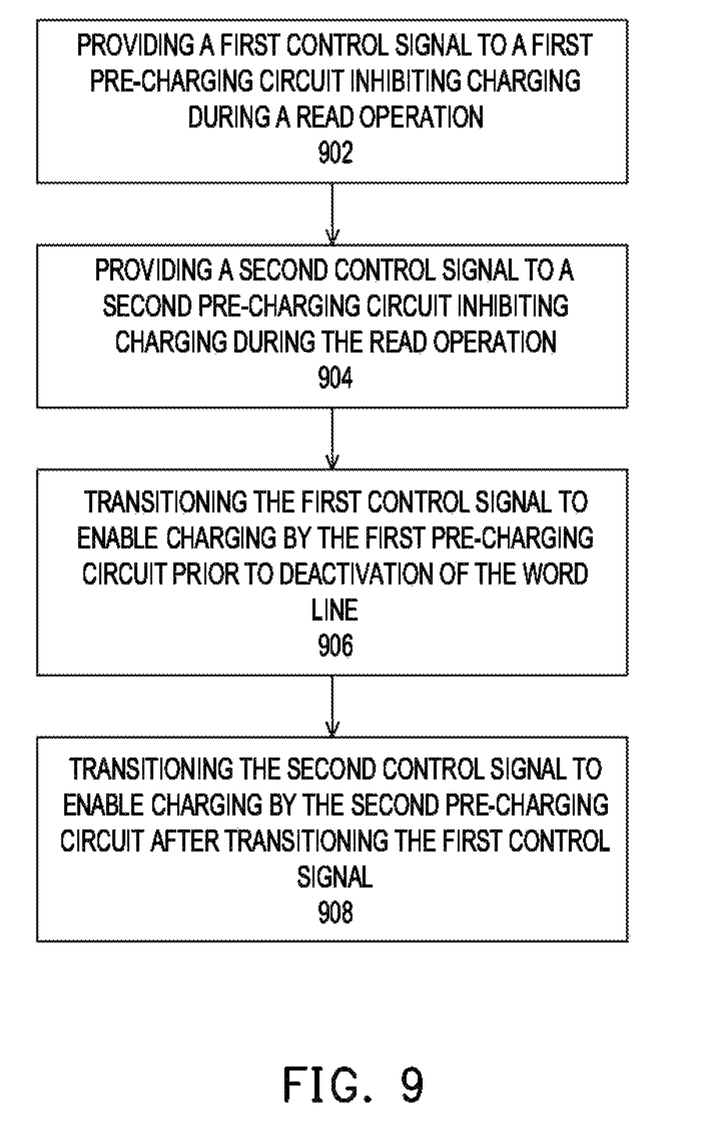
FIG. 9 is a flow diagram depicting a method of controlling a multi-stage pre-charge circuit for charging one of a bit line and bit line bar signal line associated with a bit cell prior to a read operation in accordance with embodiments.

FIG. 9 is a flow diagram depicting a method of controlling a multi-stage pre-charge circuit for charging one of a bit line and bit line bar signal line associated with a bit cell prior to a read operation in accordance with embodiments. The method is described with reference to structures described above for ease in understanding, but the method is also applicable to many other structures as well. The method includes providing a first control signal (BLEQB1) to a first pre-charging circuit (210) inhibiting charging during at least a portion of a read operation at 902, where a word line (WL) associated with the bit cell (202) is activated during the read operation. A second control signal (BLEQB2) is provided at 904 to a second pre-charging circuit (212) inhibiting charging during at least the portion of a read operation. The first control signal (BLEQB1) is transitioned at 906 to enable charging by the first pre-charging circuit (210) prior to deactivation of the word line (WL), and the second control signal (BLEQB2) is transitioned at 908 to enable charging by the second pre-charging circuit (212) after transitioning the first control signal (BLEQB1).

According to some embodiments, a memory circuit that includes a bit cell responsive to a bit line signal line and a bit line bar signal line configured to store a bit of data. A pre-charge circuit is configured to charge one of the bit line and bit line bar signal lines prior to a read operation, where the pre-charge circuit includes a first pre-charge component and a second pre-charge component, the first and second pre-charge components being individually controllable for charging the bit line and bit line bar signal lines.

In embodiments, a method of controlling a multi-stage pre-charge circuit for charging one of a bit line and bit line bar signal line associated with a bit cell prior to a read operation includes providing a first control signal to a first pre-charging circuit inhibiting charging during at least a portion of a read operation, where a word line associated with the bit cell is activated during the read operation. A second control signal is provided to a second pre-charging circuit inhibiting charging during at least the portion of a read operation. The first control signal is transitioned to enable charging by the first pre-charging circuit prior to deactivation of the word line, and the second control signal is transitioned to enable charging by the second pre-charging circuit after transitioning the first control signal.

In certain embodiments, a memory includes a two-dimensional array of bit cells, each row of bit cells being associated with a data word, each column of bit cells being associated with a multi-stage pre-charge circuit. A plurality of multi-stage pre-charge circuits are responsive to a pre-charge control circuit configured to provide a first control signal to first pre-charge components of the pre-charge circuits and a second control signal to second pre-charge components of the pre-charge circuits.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit, comprising:
a bit cell responsive to a bit line signal line and a bit line bar signal line and configured to store a bit of data; and
a pre-charge circuit configured to charge one of the bit line and bit line bar signal lines prior to a next read operation, wherein the pre-charge circuit comprises:
a first pre-charge component; and
a second pre-charge component;
wherein:
the first and second pre-charge components are individually controllable for charging the bit line and bit line bar signal lines;
the first pre-charge component is configured to charge at a first average rate and the second pre-charge component is configured to charge, alone or in combination with the first pre-charge component, at a second average rate, the second average rate being faster than the first average rate; and
the first pre-charge component comprises a first transistor having a first source/drain terminal connected to both the bit line signal line and the bit line bar signal line.

2. The memory circuit of claim 1, further comprising a pre-charge control circuit configured to provide a first control signal to the first pre-charge component and a second control signal to the second pre-charge component.

3. The memory circuit of claim 2, wherein the first transistor further has a second source/drain terminal connected to a source node and a gate controlled by the first control signal.

4. The memory of claim 2, wherein the first pre-charge component further comprises a second transistor connected between a source node and the first transistor and having a gate controlled by the first control signal.

5. The memory of claim 2, wherein the first pre-charge component further comprises a second transistor connected between a source node and the first transistor, the second transistor has a gate controlled by the first control signal, and the first transistor has a gate connected to both the bit line signal line and the bit line bar signal line.

6. The memory circuit of claim 2, wherein the first transistor further has a second source/drain terminal configured to receive the second control signal and a gate controlled by the first control signal.

7. The memory circuit of claim 2, wherein the second pre-charge component comprises two second stage transistors having gates controlled by the second control signal, one second stage transistor is positioned between a source node and a first node, and another second stage transistor is positioned between the source node and a second node.

8. The memory circuit of claim 2, wherein the pre-charge control circuit is configured to activate the first pre-charge component prior to a word line signal transition indicating a conclusion of a read operation.

9. The memory circuit of claim 8, wherein the pre-charge control circuit is configured to activate the second pre-charge circuit after the word line signal transition.

10. The memory circuit of claim 1, wherein the bit cell is a component of a first memory bank;
wherein the first pre-charge component is configured to further operate as a second pre-charge component for a second memory bank.

11. The memory circuit of claim 1, wherein the pre-charge circuit is associated with a plurality of bit cells, each bit cell being associated with a different data word.

12. The memory circuit of claim 1, wherein the pre-charge circuit includes more than two pre-charge components.

13. A method of controlling a multi-stage pre-charge circuit having a first pre-charge component and a second pre-charge component for charging one of a bit line signal line and a bit line bar signal line associated with a bit cell prior to a read operation, comprising:

providing a first control signal to the first pre-charge component inhibiting charging during at least a portion of a read operation, wherein a word line associated with the bit cell is activated during the read operation;

providing a second control signal to the second pre-charge component inhibiting charging during at least the portion of a read operation;

transitioning the first control signal to enable charging by the first pre-charge component prior to deactivation of the word line; and transitioning the second control signal to enable charging by the second pre-charge component after transitioning the first control signal;

wherein the first pre-charge component is configured to charge at a first average rate, the second pre-charge component is configured to charge, alone or in combination with the first pre-charge component, at a second average rate, the second average rate is faster than the first average rate, and the first pre-charge component comprises a transistor having a source/drain terminal connected to both the bit line signal line and the bit line bar signal line.

14. The method of claim 13, wherein the first pre-charge component charges at the first average rate when enabled and the second pre-charge component charges at the second average rate when enabled.

15. The method of claim 14, wherein one of the bit line and bit line bar signal lines transitions to a low state based on a state of the bit cell during the read operation;

wherein enabling the first pre-charge component initializes returning of the one of the bit line and bit line bar signal lines to a charged state prior to a next read operation.

16. The method of claim 13, wherein the second control signal is transitioned after deactivation of the word line.

17. The method of claim 13, further comprising:
activating the word line; and
deactivating the word line after said transitioning of the first control signal.

18. The method of claim 13, wherein the bit line signal line or the bit line bar signal line is charged without changing a state of the bit cell.

19. A memory comprising:
a two-dimensional array of bit cells, each row of bit cells being associated with a data word, each column of bit cells being associated with a multi-stage pre-charge circuit;

a plurality of multi-stage pre-charge circuits; and a pre-charge control circuit configured to provide a first control signal to first pre-charge components of the pre-charge circuits and a second control signal to second pre-charge components of the pre-charge circuits;

wherein the first pre-charge components are configured to charge at a first average rate, the second pre-charge components are configured to charge, alone or in combination with the first pre-charge components, at a second average rate, the second average rate is faster than the first average rate, and each first pre-charge component comprises a transistor having a source/drain terminal connected to both a bit line signal line and a bit line bar signal line.

20. The memory of claim 19, wherein:
the first control signal is provided to the first pre-charge components inhibiting charging during at least a portion of a read operation;

a word line associated with a bit cell is activated during the read operation;

the second control signal is provided to the second pre-charge components inhibiting charging during at least the portion of a read operation;

the first control signal is transitioned to enable charging by the first pre-charge components prior to deactivation of the word line; and the second control signal is transitioned to enable charging by the second-charge components after transitioning the first control signal.

* * * * *